(12) United States Patent
Okubo et al.

(10) Patent No.: US 8,663,875 B2
(45) Date of Patent: Mar. 4, 2014

(54) METHOD OF MANUFACTURING A PHOTOMASK

(75) Inventors: Yasushi Okubo, Tokyo (JP); Toshiyuki Suzuki, Tokyo (JP); Masahiro Hashimoto, Tokyo (JP)

(73) Assignee: Hoya Corporation, Tokyo (JP)

( * ) Notice: Subject to any disclaimer, the term of this patent is extended or adjusted under 35 U.S.C. 154(b) by 98 days.

(21) Appl. No.: 13/201,148

(22) PCT Filed: Jan. 29, 2010

(86) PCT No.: PCT/JP2010/051208
§ 371 (c)(1),
(2), (4) Date: Oct. 11, 2011

(87) PCT Pub. No.: WO2010/092879
PCT Pub. Date: Aug. 19, 2010

(65) Prior Publication Data
US 2012/0034552 A1    Feb. 9, 2012

(30) Foreign Application Priority Data

Feb. 12, 2009    (JP) ................................. 2009-030365

(51) Int. Cl.
*G03F 1/48*    (2012.01)
(52) U.S. Cl.
USPC ........................................................... 430/5

(58) Field of Classification Search
USPC .............. 430/5, 322, 324, 330; 428/426, 432, 428/433
See application file for complete search history.

(56) References Cited

U.S. PATENT DOCUMENTS

2002/0058186 A1    5/2002    Nozawa et al.
2005/0250018 A1    11/2005   Ushida et al.

FOREIGN PATENT DOCUMENTS

| JP | 7-281411 A | 10/1995 |
| JP | 10-3162 A | 1/1998 |
| JP | 10-148929 A | 6/1998 |
| JP | 11-258772 A | 9/1999 |
| JP | 2002-156742 A | 5/2002 |
| JP | 2002-162726 A | 6/2002 |
| JP | 2002-258455 A | 9/2002 |
| JP | 2006-184356 A | 7/2006 |
| WO | 2004/059384 A1 | 7/2004 |

*Primary Examiner* — Stephen Rosasco
(74) *Attorney, Agent, or Firm* — Sughrue Mion, PLLC (57) ABSTRACT

A thin film composed of a material containing a metal and silicon is formed on a transparent substrate, and a thin film pattern is formed by patterning the thin film. Then, the main surface and the side walls of the thin film pattern are previously modified so as to prevent the transfer characteristics of the thin film pattern from changing more than predetermined even in the case where exposure light with a wavelength of 200 nm or less is cumulatively applied onto the thin film pattern which has been formed. The main surface and the side walls are modified by, for instance, performing heat treatment to the main surface and the side walls at 450-900° C. in the atmosphere containing oxygen.

17 Claims, 3 Drawing Sheets

METHOD OF MANUFACTURING A PHOTOMASK

CROSS REFERENCE TO RELATED APPLICATIONS

This application is a National Stage of International Application No. PCT/JP2010/051208, filed on Jan. 29, 2010, which claims priority from Japanese Patent Application No. 2009-030365, filed on Feb. 12, 2009, the contents of all of which are incorporated herein by reference in their entirety.

TECHNICAL FIELD

This invention relates to a method of manufacturing a photomask improved in irradiation durability. In particular, this invention relates to a method of manufacturing a photomask to be suitably used in an exposure apparatus using exposure light having a short wavelength of 200 nm or less as an exposure light source.

BACKGROUND ART

Generally, fine pattern formation is carried out by the photolithography in manufacturing processes of a semiconductor device. A number of substrates called photomasks are normally used for this fine pattern formation. The photomask comprises generally a transparent glass substrate having thereon a fine pattern made of a metal thin film or the like. The photolithography is used also in the manufacture of the photomask.

In the manufacture of a photomask by the photolithography, use is made of a photomask blank having a thin film (e.g. a light-shielding film or the like) for forming a transfer pattern (mask pattern) on a transparent substrate such as a glass substrate. The manufacture of the photomask using the photomask blank comprises an exposure process of applying required pattern writing to a resist film formed on the photomask blank, a developing process of developing the resist film according to the required pattern writing to form a resist pattern, an etching process of etching the thin film according to the resist pattern, and a process of stripping and removing the remaining resist pattern. In the developing process, a developer is supplied after applying the required pattern writing to the resist film formed on the photomask blank to dissolve a portion of the resist film soluble in the developer, thereby forming the resist pattern. In the etching process, using this resist pattern as a mask, an exposed portion of the thin film, where the resist pattern is not formed, is dissolved by dry etching or wet etching, thereby forming a required mask pattern on the transparent substrate. In this manner, the photomask is produced.

For miniaturization of a pattern of a semiconductor device, it is necessary to shorten the wavelength of an exposure light source for use in the photolithography in addition to the miniaturization of the mask pattern formed in the photomask. In recent years, the wavelength of an exposure light source in the manufacture of a semiconductor device has been shortened from a KrF excimer laser (wavelength 248 nm) to an ArF excimer laser (wavelength 193 nm).

As a type of photomask, a halftone phase shift mask is known apart from a conventional binary mask having a light-shielding film pattern made of a chromium-based material on a transparent substrate. This halftone phase shift mask is configured to have a light-semitransmissive film on a transparent substrate. This light-semitransmissive film is made of, for example, a material containing a molybdenum silicide compound or the like and is adapted to transmit light having an intensity that does not substantially contribute to exposure (e.g. 1% to 20% at an exposure wavelength) and to provide a predetermined phase difference. By means of light-semitransmissive portions formed by patterning the light-semitransmissive film and light-transmissive portions formed with no light-semitransmissive film and adapted to transmit light having an intensity that substantially contributes to exposure, the halftone phase shift mask provides a relationship in which the phase of the light transmitted through the light-semitransmissive portions is substantially inverted with respect to the phase of the light transmitted through the light-transmissive portions. As a consequence, the lights having passed near the boundaries between the light-semitransmissive portions and the light-transmissive portions and bent into the others' regions due to the diffraction phenomenon cancel each other out. This makes the light intensity at the boundaries approximately zero to thereby improve the contrast, i.e. the resolution, at the boundaries.

In recent years, there have also appeared a binary mask for an ArF excimer laser using a material containing a molybdenum silicide compound as a light-shielding film, and the like.

PRIOR ART DOCUMENT

Patent Document

Patent Document 1: JP-A-2002-156742
Patent Document 2: JP-A-2002-258455

SUMMARY OF THE INVENTION

Problem to be Solved by the Invention

Following the reduction in exposure light source wavelength in recent years, however, mask degradation due to the repeated use of a photomask has become notable. Particularly in the case of a phase shift mask, a phenomenon occurs in which the transmittance and the phase difference change and further the line width changes (increases) due to the irradiation of an ArF excimer laser (wavelength 193 nm) as an exposure light source. In the case of the phase shift mask, such changes in transmittance and phase difference are serious problems that affect the mask performance. If the change in transmittance becomes large, the transfer accuracy is degraded, while if the change in phase difference becomes large, the phase shift effect at the pattern boundaries is difficult to obtain so that the contrast at the pattern boundaries is lowered and thus the resolution is significantly reduced. Further, the change in line width degrades the CD (Critical Dimension) accuracy of the photomask and finally degrades the CD accuracy of a pattern-transferred wafer.

The problem of the mask degradation due to the repeated use of the photomask is significant particularly in the case of a phase shift mask in which a compound of a material containing a transition metal and silicon (transition metal silicide) is used as a material of a light-semitransmissive film. But, also in the case of a binary mask having a light-shielding film made of a material containing a transition metal and silicon or a compound thereof, there arises a problem of degradation in CD accuracy due to a change (increase) in the line width of the light-shielding film.

According to the study of the present inventors, the background of the problem of the mask degradation due to the repeated use of the photomask is assumed as follows. Conventionally, for example, when haze is generated, cleaning is carried out for removing the haze, but a film loss (dissolution)

due to the cleaning cannot be avoided and thus, roughly, the number of times of cleaning determines the mask lifetime. However, since the number of times of cleaning is reduced due to an improvement to haze in recent years, the period of time of the repeated use of a mask is prolonged and thus the exposure time is prolonged correspondingly, and therefore, a problem of the irradiation durability particularly to short-wavelength light such as an ArF excimer laser has been newly actualized.

Also conventionally, in order to improve the irradiation durability of a light-semitransmissive film, for example, a light-semitransmissive film (phase shift film) composed mainly of a metal and silicon is heat-treated in the atmosphere or an oxygen atmosphere at 250 to 350° C. for 90 to 150 minutes (Patent Document 1) or a cap layer composed mainly of a metal and silicon is formed on a light-semitransmissive film (phase shift film) composed mainly of a metal and silicon (Patent Document 2). However, a further improvement in the irradiation durability of a film to exposure light is required in the course of the reduction in exposure light source wavelength in recent years.

Further, since the photomask manufacturing cost has been significantly increasing following the pattern miniaturization, there is an increasing need for a longer lifetime of a photomask and, also from this aspect, the further improvement in the irradiation durability of the photomask is required.

Therefore, this invention has been made for solving the conventional problems and has an object to provide a photomask manufacturing method that can improve the irradiation durability of a thin film such as a light-semitransmissive film to exposure light having a wavelength of 200 nm or less, thereby improving the lifetime of a photomask.

Means for Solving the Problem

The present inventors have assumed a cause of the degradation of the photomask due to its repeated use becoming notable following the reduction in exposure light source wavelength, as follows. As will be described in Examples, it has been elucidated from the results of tests based on diligent efforts of the present inventors that the effect of this invention is exhibited with a predetermined structure of this invention, and therefore, this invention is not restricted to an assumption described below.

As a result of examining a light-semitransmissive film pattern of a phase shift mask subjected to changes in transmittance and phase difference due to its repeated use, the present inventors have found that a modified layer containing Si, O, and a little Mo is formed on the surface layer side of a MoSi-based film and that this is one of main causes of the changes in transmittance and phase difference and a change (increase) in line width. The reason (mechanism) for the formation of such a modified layer is considered as follows. That is, the conventional sputtered MoSi-based film (light-semitransmissive film) structurally has gaps and, even if annealing is carried out after the film formation, the change in the structure of the MoSi film is small, and therefore, for example, oxygen ($O_2$) and water ($H_2O$) in the atmosphere and, further, ozone ($O_3$) and the like produced by reaction of oxygen ($O_2$) in the atmosphere with an ArF excimer laser enter the gaps and react with Si and Mo forming the light-semitransmissive film in the course of using the photomask.

That is, when Si and Mo forming the light-semitransmissive film are subjected to irradiation of exposure light (particularly short-wavelength light such as ArF) in such an environment, they are excited into a transition state so that Si is oxidized and expanded (because $SiO_2$ is larger in volume than Si) and Mo is also oxidized, thereby forming the modified layer on the surface layer side of the light-semitransmissive film. In this event, the quality of a Si oxide film formed largely differs depending on the amount of water (humidity) in the atmosphere and, as the humidity increases, the Si oxide film with a lower density is formed. In the case where the photomask is repeatedly used in the environment where the low-density Si oxide film is formed, while being cumulatively subjected to the irradiation of the exposure light, the oxidation and expansion of Si further proceed and Mo oxidized at the interface between the bulk and the modified layer diffuses in the modified layer to be deposited on a surface thereof and sublimated as, for example, $MoO_3$. Accordingly, the modified layer is further reduced in density and thus is in a state where it is easily oxidized. As a result, it is considered that the thickness of the modified layer gradually increases (the occupation ratio of the modified layer in the MoSi film increases). This phenomenon of the formation and enlargement of the modified layer is significantly observed in the case of short-wavelength exposure light such as an ArF excimer laser having energy necessary for exciting Si and Mo, i.e. the constituent atoms, of the light-semitransmissive film into the transition state, which triggers the oxidation reactions of those atoms. Such a phenomenon is not limited to the MoSi-based material, but also applies to a light-semitransmissive film made of a material containing another transition metal and silicon. Further, this also applies to a binary mask having a light-shielding film made of a material containing a transition metal and silicon.

Based on the elucidated fact and consideration described above, the present inventors have paid attention to suppressing the oxidation rate of a thin film such as a MoSi film as a measure for suppressing the formation and enlargement of a modified layer and, as a result of further continuing intensive studies, have completed this invention.

Specifically, in order to solve the above-mentioned problems, this invention has the following structures.

(Structure 1)

A method of manufacturing a photomask having, on a transparent substrate, a transfer pattern formed by patterning a thin film, the method comprising preparing a photomask blank having, on the transparent substrate, a thin film made of a material containing a metal and silicon, forming a thin film pattern by patterning the thin film of the photomask blank, and performing a treatment to modify a main surface and side walls of the formed thin film pattern in advance so as to prevent a transfer characteristic of the thin film pattern from changing more than a predetermined degree even when exposure light having a wavelength of 200 nm or less is cumulatively irradiated on the thin film pattern.

(Structure 2)

The photomask manufacturing method according to Structure 1, wherein a layer containing silicon and oxygen is formed in a surface layer of the thin film pattern by the treatment.

(Structure 3)

The photomask manufacturing method according to Structure 1 or 2, wherein the treatment is a heat treatment in an atmosphere containing oxygen at 450° C. to 900° C.

(Structure 4)

The photomask manufacturing method according to Structure 1 or 2, wherein the treatment is an oxygen plasma treatment.

(Structure 5)

The photomask manufacturing method according to any one of Structures 1 to 4, wherein a surface layer, modified by the treatment, of the thin film pattern has a thickness of 10 nm or less.

(Structure 6)

A method of manufacturing a photomask having, on a transparent substrate, a transfer pattern formed by patterning a thin film, the method comprising preparing a photomask blank having, on the transparent substrate, a thin film made of a material containing a metal and silicon, forming a thin film pattern by patterning the thin film of the photomask blank, and forming a protective film on the formed thin film pattern so as to prevent a transfer characteristic of the thin film pattern from changing more than a predetermined degree even when exposure light having a wavelength of 200 nm or less is cumulatively irradiated on the thin film pattern.

(Structure 7)

The photomask manufacturing method according to Structure 6, wherein the protective film is made of a material containing silicon and oxygen.

(Structure 8)

The photomask manufacturing method according to Structure 6 or 7, wherein the protective film has a thickness of 15 nm or less.

(Structure 9)

The photomask manufacturing method according to any one of Structures 1 to 8, wherein the thin film is a light-semitransmissive film made of a material containing a compound of transition metal silicide.

(Structure 10)

The photomask manufacturing method according to any one of Structures 1 to 8, wherein the thin film is a light-shielding film made of a material containing a compound of transition metal silicide.

(Structure 11)

The photomask manufacturing method according to Structure 9 or 10, wherein the transition metal silicide is molybdenum silicide.

As described in Structure 1, this invention is a method of manufacturing a photomask having, on a transparent substrate, a transfer pattern formed by patterning a thin film, wherein the method comprises the steps of preparing a photomask blank having, on the transparent substrate, a thin film made of a material containing a metal and silicon, forming a thin film pattern by patterning the thin film of the photomask blank, and performing a treatment to modify a main surface and side walls of the formed thin film pattern in advance so as to prevent a transfer characteristic of the thin film pattern from changing more than a predetermined degree even when exposure light having a wavelength of 200 nm or less is cumulatively irradiated on the thin film pattern.

According to this invention, by performing the treatment to modify the main surface and side walls of the formed thin film pattern in advance, it is possible to suppress the oxidation rate of Si atoms forming the thin film and thus to suppress the formation and enlargement of a modified layer conventionally caused by Si oxidation and expansion. Therefore, even if the photomask is repeatedly used with short-wavelength light, such as an ArF excimer laser, having a wavelength of 200 nm or less as an exposure light source so that the exposure light with the wavelength of 200 nm or less is cumulatively irradiated on the thin film pattern of the photomask, it is possible to suppress the change in the transfer characteristic of the thin film pattern such as, for example, a change in the transmittance, phase difference, or line width of a light-semitransmissive film.

As described in Structure 2, the treatment in this invention is, for example, a treatment to modify the main surface and side walls of the thin film pattern in advance to form a layer containing silicon and oxygen in a surface layer of the thin film pattern.

The mechanism for the formation of the modified layer in the MoSi film, for example, is as described before and, in that case, the oxidation rate (dx/dt) of Si can be given by $dx/dt = k \cdot C_0/N_0$, where k is an oxidation reaction coefficient on an oxidation interface, $C_0$ is an $O_2/H_2O$ concentration on an oxidation interface, and $N_0$ is the number of $SiO_2$ molecules per unit volume. Therefore, for example, it is possible to suppress the oxidation rate of Si by increasing the value of $N_0$. Accordingly, by performing the treatment to modify the main surface and side walls of the thin film pattern in advance to form the layer containing silicon and oxygen in the surface layer of the thin film pattern as described in Structure 2, the number of $SiO_2$ molecules in the surface layer of the thin film pattern is increased to thereby suppress the oxidation rate of Si. As a consequence, even if the photomask is irradiated with exposure light such as an ArF excimer laser in an environment containing $H_2O$, $O_2$, or $O_3$, it is possible to effectively suppress the formation and enlargement of a modified layer conventionally caused by Si oxidation and expansion. Therefore, even if the photomask is repeatedly used so that exposure light having a wavelength of 200 nm or less is cumulatively irradiated on the thin film pattern of the photomask, it is possible to suppress the change in the transfer characteristic of the thin film pattern such as, for example, a change in the transmittance, phase difference, or line width of a light-semitransmissive film.

As the treatment to modify the main surface and side walls of the thin film pattern in advance according to this invention, a heat treatment in an atmosphere containing oxygen at 450° C. to 900° C. is preferably cited as described, for example, in Structure 3. Alternatively, as described in Structure 4, an oxygen plasma treatment is also preferably cited.

The surface layer, modified by the treatment to modify the main surface and side walls of the thin film pattern in advance according to this invention, of the thin film pattern preferably has a thickness of 10 nm or less (Structure 5).

As described in Structure 6, this invention also provides a method of manufacturing a photomask having, on a transparent substrate, a transfer pattern formed by patterning a thin film, wherein the method comprises the steps of preparing a photomask blank having, on the transparent substrate, a thin film made of a material containing a metal and silicon, forming a thin film pattern by patterning the thin film of the photomask blank, and forming a protective film on the formed thin film pattern so as to prevent a transfer characteristic of the thin film pattern from changing more than a predetermined degree even when exposure light having a wavelength of 200 nm or less is cumulatively irradiated on the thin film pattern.

According to the invention of Structure 6, by forming the protective film on the formed thin film pattern, it is possible to suppress the oxidation rate of Si atoms forming the thin film and thus to suppress the conventional formation and enlargement of a modified layer. Therefore, even if the photomask is repeatedly used with short-wavelength light, such as an ArF excimer laser, having a wavelength of 200 nm or less as an exposure light source so that the exposure light with the wavelength of 200 nm or less is cumulatively irradiated on the thin film pattern of the photomask, it is possible to suppress the change in the transfer characteristic of the thin film pattern such as, for example, a change in the transmittance, phase difference, or line width of a light-semitransmissive film.

As described in Structure 7, the protective film is preferably made of a material containing silicon and oxygen. For example, by forming a protective film made of a material containing silicon and oxygen on a MoSi thin film to thereby increase the number ($N_0$) of $SiO_2$ molecules at the surface of the thin film pattern, it is possible to suppress the oxidation rate of Si.

In this case, the thickness of the protective film is preferably 15 nm or less (Structure 8).

This invention is suitable for the manufacture of, for example, a phase shift mask in which the thin film is a light-semitransmissive film made of a material containing a compound of transition metal silicide as described in Structure 9 or a binary mask in which the thin film is a light-shielding film made of a material containing a compound of transition metal silicide as described in Structure 10. In particular, this invention is suitable for the manufacture of a phase shift mask or a binary mask using a thin film made of a material containing a compound of molybdenum silicide among transition metal silicides (Structure 11).

Effect of the Invention

According to this invention, by preparing a photomask blank having, on a transparent substrate, a thin film made of a material containing a metal and silicon, forming a thin film pattern by patterning the thin film of the photomask blank, and then performing a treatment to modify a main surface and side walls of the formed thin film pattern in advance or forming a protective film on the formed thin film pattern so as to prevent a transfer characteristic of the thin film pattern from changing more than a predetermined degree even when exposure light having a wavelength of 200 nm or less is cumulatively irradiated on the thin film pattern, there is obtained a photomask that can improve the irradiation durability of the thin film such as a light-semitransmissive film to the exposure light with the wavelength of 200 nm or less, thereby improving the photomask lifetime.

MODE FOR CARRYING OUT THE INVENTION

Hereinbelow, embodiments of this invention will be described in detail.

First Embodiment

This invention is a method of manufacturing a photomask having, on a transparent substrate, a transfer pattern formed by patterning a thin film, wherein the method comprises the steps of preparing a photomask blank having, on the transparent substrate, a thin film made of a material containing a metal and silicon, forming a thin film pattern by patterning the thin film of the photomask blank, and performing a treatment to modify a main surface and side walls of the formed thin film pattern in advance so as to prevent a transfer characteristic of the thin film pattern from changing more than a predetermined degree even when exposure light having a wavelength of 200 nm or less is cumulatively irradiated on the thin film pattern.

The transparent substrate is not particularly limited as long as it has transparency at an exposure wavelength to be used. In this invention, a quartz substrate and various other glass substrates (e.g. soda-lime glass, aluminosilicate glass, etc.) can be used and, among them, the quartz substrate is particularly suitable for this invention because it has high transparency in the range of ArF excimer laser to shorter wavelengths.

The thin film for forming the transfer pattern (thin film pattern) is a thin film made of a material containing a metal and silicon, such as, for example, a light-semitransmissive film or a light-shielding film made of a material containing a compound of transition metal silicide (particularly molybdenum silicide), which will be described in detail later.

As a method of forming the thin film on the transparent substrate, a sputtering film forming method, for example, is preferably cited, but this invention is not necessarily limited to the sputtering film forming method.

Using the photomask blank having, on the transparent substrate, the thin film made of the material containing the metal and silicon, the thin film pattern is formed by patterning the thin film of the photomask blank by the photolithography. Specifically, a positive resist film for electron beam writing, for example, is formed on the photomask blank and then is subjected to writing of a predetermined device pattern. After the writing, the resist film is developed so that a resist pattern is formed. Then, the thin film is etched using the resist pattern as a mask so that the thin film pattern can be formed. As an etching method in this event, it is possible to preferably use dry etching which is effective for forming a fine pattern.

In this invention, the treatment to modify the main surface and side walls in advance is applied to the thin film pattern thus formed.

In the first embodiment, as the treatment to modify the main surface and side walls of the thin film pattern in advance, a heat treatment is carried out in an atmosphere containing oxygen at 450° C. to 900° C. If the heating temperature is less than 450° C., there is a problem that the cleaning resistance and the hot water resistance are reduced. On the other hand, if the heating temperature is higher than 900° C., there arises a possibility of degradation of the thin film itself.

In this invention, it is particularly preferable that the heat treatment be in the range of 550° C. to 650° C. This is considered to be because Si—N bonds increase around 600° C.

A heating apparatus for use in the heat treatment is optional, such as, for example, a heating furnace, an oven, or a hot plate.

The heat treatment is carried out in an atmosphere containing oxygen and is preferably carried out, for example, in an oxygen-substituted atmosphere in a heating furnace. Naturally, the heat treatment may be carried in the atmosphere.

The heat treatment time may be determined by taking into account both the heating temperature and the thickness of a surface layer, to be modified by the heat treatment, of the thin film and is, in general, suitably about 1 to 3 hours.

In the first embodiment, the thickness of the surface layer, modified by the heat treatment to modify the main surface and side walls of the thin film pattern in advance, of the thin film pattern is preferably 10 nm or less and particularly preferably 5 nm or less. If the thickness of the modified surface layer is greater than 10 nm, the change in transmittance due to the modified surface layer becomes large so that it is difficult to perform a film design expecting in advance such a change in transmittance. The lower limit of the thickness of the modified surface layer is preferably 1 nm or more. If it is less than 1 nm, the effect of suppressing the oxidation rate of Si forming the thin film is not sufficiently obtained.

According to the first embodiment, by performing the heat treatment in an atmosphere containing oxygen at 450° C. to 900° C. as the treatment to modify the main surface and side walls of the thin film pattern in advance, it is possible to modify the main surface and side walls of the thin film pattern in advance to thereby form a layer containing silicon and oxygen in the surface layer of the thin film pattern. By forming the layer containing silicon and oxygen in the surface layer of the thin film pattern, the number of $SiO_2$ molecules in the surface layer of the thin film pattern is increased to thereby suppress the oxidation rate of Si. As a consequence, even if the photomask is irradiated with exposure light such as an ArF excimer laser in an environment containing $H_2O$, $O_2$, or $O_3$, it is possible to effectively suppress the formation and enlargement of a modified layer conventionally caused by Si oxidation and expansion. Therefore, even if the photomask is repeatedly used so that exposure light having a wavelength of 200 nm or less is cumulatively irradiated on the thin film pattern of the photomask, it is possible to suppress the change in the transfer characteristic of the thin film pattern such as, for example, a change in the transmittance, phase difference, or line width of a light-semitransmissive film.

By applying the treatment of this invention to the formed thin film pattern, particularly the side walls of the pattern can be protected so that it is possible to achieve film strengthening at the side walls of the pattern and thus to further reduce the change in line width.

When, for example, an ArF excimer laser is continuously irradiated on a photomask obtained by the first embodiment so that the total dose becomes 30 $kJ/cm^2$, changes in the optical properties of, for example, a MoSi-based light-semitransmissive film before and after the irradiation are such that the change in transmittance can be within 0.60% and the change in phase difference can be within 3.0 degrees. Further, the change in transmittance can be within 0.05% and the change in phase difference can be within 1.0 degree. In this manner, the changes in optical properties are suppressed to be small and the changes on this level do not affect the performance of the photomask. Further, also with respect to an increase in the line width (CD change) of a light-semitransmissive film pattern, it can be suppressed to 10 nm or less.

Assuming that the thickness of a modified layer formed in a surface layer of the light-semitransmissive film pattern is $\Delta d$, the CD change is defined as 2 $\Delta d$.

When, likewise, an ArF excimer laser is continuously irradiated on a photomask, having, for example, a MoSi-based light-shielding film pattern, obtained by the first embodiment so that the total dose becomes 30 $kJ/cm^2$, it is possible to suppress an increase in the line width (CD change) of the light-shielding film pattern to 10 nm or less.

The dose of 30 $kJ/cm^2$ (energy density: about 25 $mJ/cm^2$) corresponds to the use of about 100,000 times of a photomask and corresponds to the use for about three months with a normal frequency of use of a photomask. Therefore, according to this invention, it can be said that it is possible to further improve, than conventional, the irradiation durability of a thin film such as a light-semitransmissive film to exposure light having a wavelength of 200 nm or less, thereby significantly improving the photomask lifetime.

Second Embodiment

In the second embodiment, as the treatment to modify the main surface and side walls of the thin film pattern in advance, an oxygen plasma treatment is carried out. Specifically, the oxygen plasma treatment is carried out, for example, by providing an oxygen gas atmosphere in a chamber, applying a predetermined RF ICP power and RF bias power to thereby convert an oxygen gas into plasma, and irradiating the oxygen plasma on the thin film pattern-formed substrate placed in the chamber.

It is preferable that the substrate formed with the thin film pattern be heated in the oxygen plasma treatment.

The treatment time by the oxygen plasma irradiation (irradiation time) may be determined by taking into account both the oxygen plasma treatment conditions and the thickness of a surface layer, to be modified by the treatment, of the thin film pattern and is, in general, suitably about 1 to 10 minutes.

In the second embodiment, the thickness of the surface layer, modified by the oxygen plasma treatment to modify the main surface and side walls of the thin film pattern in advance, of the thin film pattern is preferably 10 nm or less and particularly preferably 5 nm or less. If the thickness of the modified surface layer is greater than 10 nm, the change in transmittance due to the modified surface layer becomes large so that it is difficult to perform a film design expecting in advance such a change in transmittance. The lower limit of the thickness of the modified surface layer is preferably 1 nm or more. If it is less than 1 nm, the effect of suppressing the oxidation rate of Si forming the thin film is not sufficiently obtained.

According to the second embodiment, by performing the oxygen plasma treatment as the treatment to modify the main surface and side walls of the thin film pattern in advance, it is possible to modify the main surface and side walls of the thin film pattern in advance to thereby form a layer containing silicon and oxygen in the surface layer of the thin film pattern. By forming the layer containing silicon and oxygen in the surface layer of the thin film pattern, the number of $SiO_2$ molecules in the surface layer of the thin film pattern is increased to thereby suppress the oxidation rate of Si. As a consequence, even if the photomask is irradiated with exposure light such as an ArF excimer laser in an environment containing $H_2O$, $O_2$, or $O_3$, it is possible to effectively suppress the formation and enlargement of a modified layer conventionally caused by Si oxidation and expansion. Therefore, even if the photomask is repeatedly used so that exposure light having a wavelength of 200 nm or less is cumulatively irradiated on the thin film pattern of the photomask, it is possible to suppress the change in the transfer characteristic of the thin film pattern such as, for example, a change in the transmittance, phase difference, or line width of a light-semitransmissive film.

When, for example, an ArF excimer laser is continuously irradiated on a photomask obtained by the second embodiment so that the total dose becomes 30 $kJ/cm^2$, it is possible to suppress changes in transfer characteristics more than the above-mentioned first embodiment. For example, changes in the optical properties of a MoSi-based light-semitransmissive film before and after the irradiation are such that the change in transmittance can be within 0.1% and the change in phase difference can be within 1.0 degree and, further, with respect to an increase in the line width (CD change) of a light-semitransmissive film pattern, it can be suppressed to 6 nm or less and further to 3 nm or less. When, likewise, an ArF excimer laser is continuously irradiated on a photomask, having, for example, a MoSi-based light-shielding film pattern, obtained by the second embodiment so that the total dose becomes 30 $kJ/cm^2$, it is possible to suppress an increase in the line width (CD change) of the light-shielding film pattern to 6 nm or less and further to 3 nm or less.

Before performing the above-mentioned oxygen plasma treatment, a low-temperature heat treatment at, for example, 280° C. or less may be applied to the thin film pattern-formed substrate.

Third Embodiment

In the third embodiment, a thin film made of a material containing a metal and silicon is formed on a transparent substrate and, then, in order to prevent a transfer characteristic of a thin film pattern of a photomask, formed by patterning the thin film, from changing more than a predetermined degree even when exposure light having a wavelength of 200 nm or less is cumulatively irradiated on the thin film pattern, a protective film is formed on the formed thin film pattern. By forming the protective film on the formed thin film pattern, it is possible to suppress the oxidation rate of Si atoms forming the thin film pattern and thus to suppress the formation and enlargement of a modified layer conventionally caused by Si oxidation and expansion.

The protective film is preferably made of a material containing silicon and oxygen. For example, by forming a protective film made of a material containing silicon and oxygen on a MoSi-based thin film pattern to thereby increase the number ($N_0$) of $SiO_2$ molecules at the surface of the thin film pattern, it is possible to suppress the oxidation rate of Si. As the protective film made of the material containing silicon and oxygen, there can be cited, for example, SiON, $SiO_2$, SiOC, SiOCN, or the like. SiON or $SiO_2$ is particularly preferable.

The composition of the protective film is preferably Si=20 to 50 at %, O=30 to 60 at %, N=0 to 40 at %, and C=0 to 20 at % and is preferably adjusted so that the transmittance for ArF excimer laser light becomes 90% or more. More preferably, Si=25 to 45 at %, 0=35 to 55 at %, and N=10 to 25 at %.

As a method of forming the protective film on the thin film pattern, a sputtering film forming method, for example, can be preferably used. Naturally, the method is not necessarily limited to the sputtering film forming method and another film forming method may alternatively be used.

When the protective film is formed on the thin film pattern, the protective film is also formed on a surface, where the thin film is not provided, of the transparent substrate. However, this does not affect the use of the photomask by setting the transmittance for ArF excimer laser light to 90% or more and optimizing bias correction.

In the third embodiment, the thickness of the protective film formed on the thin film pattern is preferably 15 nm or less and particularly preferably 10 nm or less. If the thickness of the protective film is greater than 15 nm, the change in transmittance due to the formed protective film becomes large so that it is difficult to perform a film design expecting in advance such a change in transmittance. The lower limit of the thickness of the protective film is preferably 3 nm or more. If it is less than 3 nm, the effect of suppressing the oxidation rate of Si forming the thin film pattern is not sufficiently obtained.

According to the third embodiment, by forming the protective film containing, for example, silicon and oxygen on the thin film pattern, the number of $SiO_2$ molecules in the surface layer of the thin film pattern is increased to thereby suppress the oxidation rate of Si. As a consequence, even if the photomask is irradiated with exposure light such as an ArF excimer laser in an environment containing $H_2O$, $O_2$, or $O_3$, it is possible to effectively suppress the formation and enlargement of a modified layer conventionally caused by Si oxidation and expansion. Therefore, even if the photomask is repeatedly used so that exposure light having a wavelength of 200 nm or less is cumulatively irradiated on the thin film pattern of the photomask, it is possible to suppress the change in the transfer characteristic of the thin film pattern such as, for example, a change in the transmittance, phase difference, or line width of a light-semitransmissive film.

Even when, for example, an ArF excimer laser is continuously irradiated on a photomask obtained by the third embodiment so that the total dose becomes 30 $kJ/cm^2$, it is possible to suppress changes in transfer characteristics more than the above-mentioned first embodiment. For example, changes in the optical properties of a MoSi-based light-semitransmissive film before and after the irradiation are such that the change in transmittance can be within 0.1% and the change in phase difference can be within 1.0 degree and, further, with respect to an increase in the line width (CD change) of a light-semitransmissive film pattern, it can be suppressed to 6 nm or less and further to 3 nm or less. Even when, likewise, an ArF excimer laser is continuously irradiated on a photomask, having, for example, a MoSi-based light-shielding film pattern, obtained by the third embodiment so that the total dose becomes 30 $kJ/cm^2$, it is possible to suppress an increase in the line width (CD change) of the light-shielding film pattern to 6 nm or less and further to 3 nm or less.

As described by the above-mentioned embodiments, this invention is suitable for the manufacture of a photomask for use in an exposure apparatus using short-wavelength exposure light having a wavelength of particularly 200 nm or less as an exposure light source. For example, this invention is suitable for the manufacture of the following photomasks.

(1) Phase Shift Mask in which the Thin Film is a Light-Semitransmissive Film Made of a Material Containing a Compound of Transition Metal Silicide (Particularly Molybdenum Silicide)

In the case of the phase shift mask manufactured by this invention, even if the photomask is repeatedly used with short-wavelength light such as, for example, an ArF excimer laser as an exposure light source, changes in the transmittance, phase difference, line width, and the like of the light-semitransmissive film are suppressed so that the performance is not degraded, and therefore, the lifetime of the photomask can be significantly improved.

As such a phase shift mask, there is a halftone phase shift mask with a structure having a light-semitransmissive film on a transparent substrate, which is of the type in which phase shifter portions are provided by patterning the light-semitransmissive film.

The light-semitransmissive film is adapted to transmit light having an intensity that does not substantially contribute to exposure (e.g. 1% to 20% at an exposure wavelength) and to provide a predetermined phase difference (e.g. 180 degrees). By means of light-semitransmissive portions formed by patterning the light-semitransmissive film and light-transmissive portions formed with no light-semitransmissive film and adapted to transmit light having an intensity that substantially contributes to exposure, the halftone phase shift mask provides a relationship in which the phase of the light transmitted through the light-semitransmissive portions is substantially inverted with respect to the phase of the light transmitted through the light-transmissive portions. As a consequence, the lights having passed near the boundaries between the light-semitransmissive portions and the light-transmissive portions and bent into the others' regions due to the diffraction phenomenon cancel each other out. This makes the light intensity at the boundaries approximately zero to thereby improve the contrast, i.e. the resolution, at the boundaries.

As another phase shift mask, there is cited a Levenson-type phase shift mask or an enhancer-type phase shift mask with a structure having a light-shielding film or a light-semitransmissive film on a transparent substrate, which is of the substrate dug-down type in which phase shifter portions are provided by digging down the transparent substrate by etching or the like.

Further, as a phase shift mask, there is cited one with a structure having a light-semitransmissive film on a transparent substrate and further having a light-shielding film on the light-semitransmissive film for preventing pattern failure of a transfer target substrate due to a light-semitransmissive film pattern to be formed in a transfer region based on light transmitted through the light-semitransmissive film.

The light-semitransmissive film is made of a material containing a transition metal silicide compound and there can be cited a material composed mainly of transition metal silicide and oxygen and/or nitrogen. As a transition metal, use can be made of molybdenum, tantalum, tungsten, titanium, hafnium, nickel, vanadium, zirconium, niobium, palladium, ruthenium, rhodium, or the like.

In particular, when the light-semitransmissive film is formed of molybdenum silicide nitride (MoSiN) and a heat treatment or the like is carried out as a treatment to modify a main surface of the MoSiN film, the content ratio of Mo and Si in the MoSiN film is preferably such that Mo is 10% or more and 14% or less (preferably 11% or more and 13% or less) for maintaining a predetermined phase difference and transmittance and suppressing a change in transmittance due to the heat treatment.

In the case of the structure having the light-shielding film on the light-semitransmissive film, since the material of the light-semitransmissive film contains transition metal silicide, a material of the light-shielding film comprises chromium having etching selectivity (etching resistance) to the light-semitransmissive film, or a chromium compound in which an element such as oxygen, nitrogen, or carbon is added to chromium.

By providing an etching stopper film (e.g. chromium-based film) on the light-semitransmissive film, the light-shielding film can be made of the same transition metal silicide-based material as that of the light-semitransmissive film. In this case, by applying the treatment of this invention, patterns of both the light-semitransmissive film and the light-shielding film can be prevented from being modified, which is thus effective.

In the case where the above-mentioned heat treatment is carried out in the structure having the light-shielding film on the light-semitransmissive film, there is a case where the OD (Optical Density) of the light-shielding film changes due to the heat treatment so that a desired OD cannot be obtained. In this case, however, the film formation may be carried out expecting in advance a CD change due to the heat treatment. Specifically, by increasing the thickness of the light-shielding film or changing the composition ratio thereof, the film formation may be carried out so that the CD becomes relatively higher in the state of a mask blank.

(2) Binary Mask in which the Thin Film is a Light-Shielding Film Made of a Material Containing a Compound of Transition Metal Silicide (Particularly Molybdenum Silicide)

In the case of the binary mask with the transition metal silicide-based light-shielding film manufactured by this invention, even if the photomask is repeatedly used with short-wavelength light such as an ArF excimer laser as an exposure light source, a reduction in the light-shielding properties of the light-shielding film, a change in the line width thereof, and the like are suppressed so that the performance is not degraded, and therefore, the lifetime of the photomask can be significantly improved.

Such a binary mask has a structure having a pattern of the light-shielding film on a transparent substrate. The light-shielding film is made of a material containing a transition metal silicide compound and there can be cited a material composed mainly of transition metal silicide and oxygen and/or nitrogen. As a transition metal, use can be made of molybdenum, tantalum, tungsten, titanium, hafnium, nickel, vanadium, zirconium, niobium, palladium, ruthenium, rhodium, or the like.

In particular, when the light-shielding film is formed of molybdenum silicide compounds and has a two-layer structure of a light-shielding layer (MoSi or the like) and a front-surface antireflection layer (MoSiON or the like) or a three-layer structure further comprising a back-surface antireflection layer (MoSiON or the like) between the light-shielding layer and the substrate, the content ratio of Mo and Si in the molybdenum silicide compound of the light-shielding layer is preferably such that Mo is 9% or more and 40% or less (preferably 15% or more and 40% or less and more preferably 20% or more and 40% or less) in terms of the light-shielding properties.

The light-shielding film may be a composition gradient film in which the composition in its thickness direction changes continuously or stepwise.

Further, in order to reduce the thickness of a resist film to thereby form a fine pattern, the structure may have an etching mask film on the light-shielding film. This etching mask film is made of a material comprising chromium having etching selectivity (etching resistance) to etching of the light-shielding film containing transition metal silicide, or a chromium compound in which an element such as oxygen, nitrogen, or carbon is added to chromium.

In this event, by giving an antireflection function to the etching mask film, a photomask may be manufactured in the state where the etching mask film remains on the light-shielding film. In this case, the treatment of this invention, when applied, effectively works on side walls of a pattern. On the other hand, when a photomask is manufactured by stripping the etching mask film from the light-shielding film, the treatment of this invention, when applied, works on a surface and side walls of a light-shielding film pattern.

EXAMPLES

Hereinbelow, the embodiments of this invention will be described in further detail with reference to Examples.

Example 1

Figure 1:
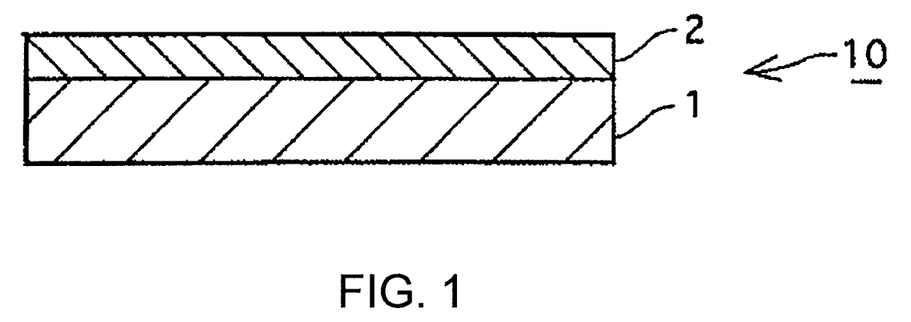
FIG. 1 is a sectional view of a phase shift mask blank according to Example 1 of this invention.

FIG. 1 is a sectional view of a phase shift mask blank 10 for use in Example 1 of this invention.

Using a synthetic quartz glass substrate having a 6-inch square size with a thickness of 0.25 inches as a transparent substrate 1, a light-semitransmissive film 2 made of nitrided molybdenum and silicon was formed on the transparent substrate 1.

Specifically, using a mixed target of molybdenum (Mo) and silicon (Si) (Mo:Si=10 mol %:90 mol %), reactive sputtering (DC sputtering) was carried out by setting the power of a DC power supply to 3.0 kW in a mixed gas atmosphere of argon (Ar), nitrogen ($N_2$), and helium (He) (gas flow rate ratio Ar:$N_2$:He=5:49:46) at a gas pressure of 0.3 Pa, thereby forming a MoSiN film made of molybdenum, silicon, and nitrogen and having a thickness of 69 nm. The MoSiN film had a transmittance of 4.52% and a phase difference of 182.5 degrees for an ArF excimer laser.

In the manner described above, the phase shift mask blank 10 was manufactured.

Figure 2:
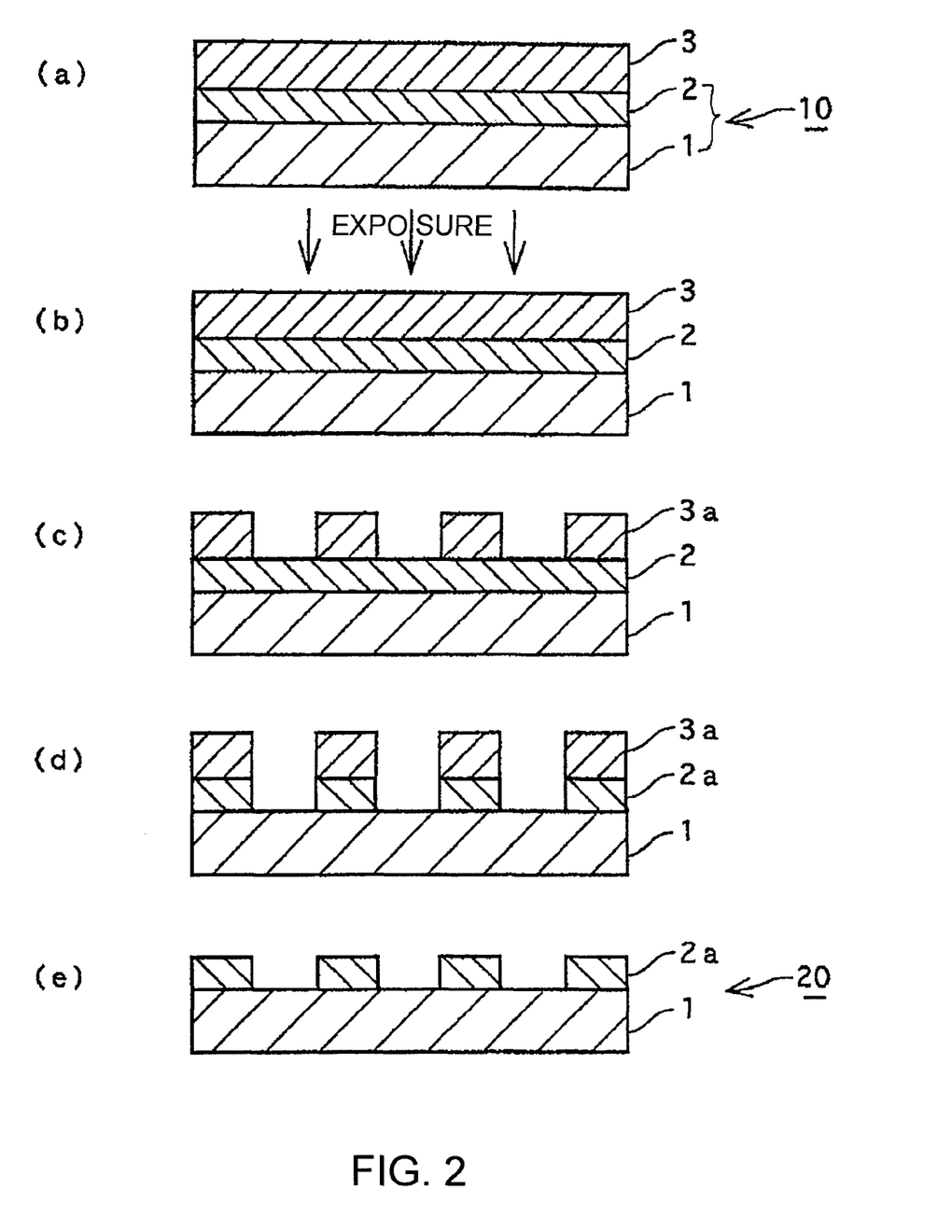
FIG. 2 is sectional views showing processes of manufacturing a phase shift mask using the phase shift mask blank according to Example 1 of this invention.

Then, a halftone phase shift mask was manufactured using the phase shift mask blank 10. FIG. 2, (a) to (e) are sectional views showing processes of manufacturing the phase shift mask using the phase shift mask blank. First, a chemically amplified positive resist film for electron beam writing (PRL009 manufactured by FUJIFILM Electronic Materials Co., Ltd.) was formed as a resist film 3 on the phase shift mask blank 10 (see FIG. 2, (a)). The resist film 3 was formed by spin coating using a spinner (spin coating apparatus).

Then, using an electron beam writing apparatus, a required pattern was written on the resist film 3 formed on the phase shift mask blank 10 and, thereafter, the resist film 3 was developed with a predetermined developer, thereby forming a resist pattern 3a (see FIG. 2, (b) and (c)).

Then, using the resist pattern 3a as a mask, the light-semitransmissive film 2 (MoSiN film) was etched, thereby forming a light-semitransmissive film pattern 2a (see FIG. 2, (d)). A mixed gas of $SF_6$ and He was used as a dry etching gas.

Then, the remaining resist pattern was stripped, thereby obtaining a thin film pattern-formed substrate (phase shift mask) 20 formed with the MoSiN film pattern (thin film pattern) (see FIG. 2, (e)). There was almost no change in transmittance and phase difference of the light-semitransmissive film as compared with those at the time of the manufacture of the mask blank.

Then, a heat treatment was applied to the substrate formed with the MoSiN film pattern. Specifically, using a heating furnace, the heat treatment was carried out in the atmosphere at a heating temperature of 550° C. for a heating time of 1 hour. Upon observing a section of the MoSiN film in detail after the heat treatment using a TEM (transmission electron microscope), a coating film with a thickness of about 1 nm was formed in a surface layer portion of a main surface and side walls of the MoSiN film pattern. Further, upon analyzing the composition of this coating film in detail, it was confirmed to be a film composed mainly of Si and oxygen. The MoSiN film after the heat treatment had a transmittance of 6.16% and a phase difference of 184.4 degrees for an ArF excimer laser. Therefore, changes before and after the heat treatment were such that the change in transmittance was +1.64% and the change in phase difference was +1.9 degrees. The film design may be carried out expecting these changes in advance, thereby obtaining desired optical properties.

An ArF excimer laser was continuously irradiated on the phase shift mask obtained by the above-mentioned heat treatment so that the total dose became 30 $kJ/cm^2$. As described before, the dose of 30 $kJ/cm^2$ (energy density: about 25 $mJ/cm^2$) corresponds to the use of about 100,000 times of a photomask and corresponds to the use for about three months with a normal frequency of use of a photomask.

The transmittance and phase difference of the light-semitransmissive film (MoSiN film) after the irradiation were measured. As a result, the transmittance was 6.70% and the phase difference was 181.9 degrees for the ArF excimer laser. Therefore, changes before and after the irradiation were such that the change in transmittance was +0.54% and the change in phase difference was −2.5 degrees, and thus, the changes were suppressed to be small and the changes on this level do not affect the performance of the photomask. Further, a section of the light-semitransmissive film pattern was observed in detail using a TEM (transmission electron microscope). As a result, a thick modified layer as conventionally formed was not particularly confirmed and, further, an increase in line width (CD change) was suppressed to 10 nm or less. Therefore, it is seen that the phase shift mask of Example 1 has extremely high irradiation durability to cumulative irradiation of an exposure light source with a short wavelength of 200 nm or less.

Example 2

A MoSiN film was formed as a light-semitransmissive film on a transparent substrate in completely the same manner as in Example 1, thereby manufacturing a phase shift mask blank. The transmittance and phase difference of the MoSiN film for an ArF excimer laser were approximately the same as those in Example 1.

Then, a thin film pattern-formed substrate was manufactured using the phase shift mask blank in the same manner as in Example 1. There was almost no change in the transmittance and phase difference of the MoSiN light-semitransmissive film in the manufactured thin film pattern-formed substrate as compared with those at the time of the manufacture of the mask blank.

Then, an oxygen plasma treatment was applied to the substrate formed with the MoSiN film pattern. Specifically, by providing an $O_2$ gas atmosphere ($O_2$ gas flow rate 100 sccm, pressure 5 Pa) in a chamber and applying the RF ICP power at 750 W and the RF bias power at 250 W, the $O_2$ gas was formed into a plasma and the oxygen plasma was irradiated on the MoSiN film pattern. In this event, there were prepared two substrates each formed with the above-mentioned pattern and the irradiation time of the oxygen plasma was set to 5 minutes and 10 minutes to measure changes in optical properties in the respective cases.

When the irradiation time was 5 minutes, the MoSiN film after the oxygen plasma irradiation was such that the transmittance was 5.16% and the phase difference was 184.7 degrees for an ArF excimer laser. Therefore, changes before and after the oxygen plasma irradiation were such that the change in transmittance was +0.64% and the change in phase difference was +2.2 degrees.

On the other hand, when the oxygen plasma irradiation time was 10 minutes, the transmittance was 5.27% and the phase difference was 180.2 degrees for an ArF excimer laser. Therefore, changes before and after the oxygen plasma irradiation were such that the change in transmittance was +0.75% and the change in phase difference was −2.3 degrees.

Upon observing a section of the MoSiN film in detail after the oxygen plasma irradiation using a TEM (transmission electron microscope), a coating film with a thickness of about 5 to 10 nm was formed in a surface layer portion of the MoSiN film for each irradiation time. Further, upon analyzing the composition of this coating film in detail, it was confirmed to be a film composed mainly of Si and oxygen.

In the manner described above, phase shift masks of Example 2 were manufactured.

An ArF excimer laser was continuously irradiated on each of the obtained phase shift masks of Example 2 so that the total dose became 30 $kJ/cm^2$. The transmittance and phase difference of each light-semitransmissive film (MoSiN film) after the ArF excimer laser irradiation were measured.

In the case of the light-semitransmissive film for which the oxygen plasma irradiation time was 5 minutes, the transmittance was 5.13% and the phase difference was 184.2 degrees due to the ArF excimer laser irradiation. Therefore, changes before and after the ArF excimer laser irradiation were such that the change in transmittance was −0.03% and the change in phase difference was −0.5 degrees.

On the other hand, in the case of the light-semitransmissive film for which the oxygen plasma irradiation time was 10 minutes, the transmittance was 5.31% and the phase difference was 179.9 degrees due to the ArF excimer laser irradiation. Therefore, changes before and after the ArF excimer laser irradiation were such that the change in transmittance was +0.04% and the change in phase difference was −0.3 degrees.

Therefore, the changes were suppressed to be small in each case and the changes on this level do not affect the performance of the photomask. Further, a section of each of the light-semitransmissive film patterns was observed in detail using a TEM (transmission electron microscope). As a result, a thick modified layer as conventionally formed was not particularly confirmed and, further, an increase in line width (CD change) was suppressed to 6 nm or less. Therefore, it is seen that the phase shift masks of Example 2 also have extremely high irradiation durability to cumulative irradiation of an exposure light source with a short wavelength of 200 nm or less.

Example 3

A MoSiN film was formed as a light-semitransmissive film on a transparent substrate in completely the same manner as in Example 1, thereby manufacturing a phase shift mask blank. The transmittance and phase difference of the MoSiN film for an ArF excimer laser were approximately the same as those in Example 1.

Then, a thin film pattern-formed substrate was manufactured using the phase shift mask blank in the same manner as in Example 1. There was almost no change in the transmittance and phase difference of the MoSiN light-semitransmissive film in the manufactured thin film pattern-formed substrate as compared with those at the time of the manufacture of the mask blank.

Figure 3:
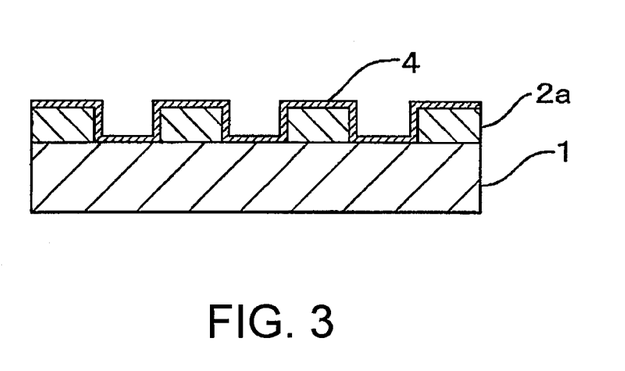
FIG. 3 is a sectional view of a phase shift mask according to Example 3 of this invention.

Then, with respect to the substrate formed with the MoSiN film pattern (see FIG. 2e), a protective film 4 in the form of a SiON film was formed on the MoSiN film pattern by sputtering (see FIG. 3). Specifically, using a Si target, reactive sputtering (DC sputtering) was carried out by setting the power of a DC power supply to 3.0 kW in a mixed gas atmosphere of Ar and nitrogen monoxide (NO) (gas flow rate ratio Ar:NO=1:4) at a gas pressure of 0.2 Pa, thereby forming a SiON film made of silicon, oxygen, and nitrogen (Si:35.5 at %, O:44.9 at %, N:18.5 at %) and having a thickness of 5 nm. The MoSiN film pattern formed with this SiON film had a transmittance of 6.23% and a phase difference of 184.8 degrees for an ArF excimer laser. Therefore, changes after the SiON film formation were such that the change in transmittance was +1.71% and the change in phase difference was +2.3 degrees.

In the manner described above, a phase shift mask of Example 3 was manufactured.

An ArF excimer laser was continuously irradiated on the obtained phase shift mask of Example 3 so that the total dose became 30 kJ/cm$^2$. The transmittance and phase difference of the light-semitransmissive film (MoSiN film) after the irradiation were measured. As a result, the transmittance was 6.22% and the phase difference was 184.3 degrees for the ArF excimer laser. Therefore, changes before and after the irradiation were such that the change in transmittance was −0.01% and the change in phase difference was −0.5 degrees, and thus, the changes were suppressed to be small and the changes on this level do not affect the performance of the photomask. Further, a section of the light-semitransmissive film pattern was observed in detail using a TEM (transmission electron microscope). As a result, a thick modified layer as conventionally formed was not particularly confirmed and, further, an increase in line width (CD change) was suppressed to 6 nm or less. Therefore, it is seen that the phase shift mask of Example 3 also has extremely high irradiation durability to cumulative irradiation of an exposure light source with a short wavelength of 200 nm or less.

Example 4

Using a synthetic quartz glass substrate having a 6-inch square size with a thickness of 0.25 inches as a transparent substrate, a MoSiON film (back-surface antireflection layer), a MoSi film (light-shielding layer), and a MoSiON film (front-surface antireflection layer) were formed as a light-shielding film on the transparent substrate.

Specifically, using a mixed target of Mo and Si (Mo:Si=21 mol %:79 mol %), a film made of molybdenum, silicon, oxygen, and nitrogen (Mo: 0.3 at %, Si: 24.6 at %, O: 22.5 at %, N: 52.6 at %) and having a thickness of 7 nm was formed by setting the power of a DC power supply to 3.0 kW in a mixed gas atmosphere of Ar, $O_2$, $N_2$, and He (gas flow rate ratio Ar:$O_2$:$N_2$:He=5:4:49:42) at a gas pressure of 0.2 Pa.

Then, using a target of Mo:Si=21 mol %:79 mol %, a film made of molybdenum and silicon (Mo: 21.0 at %, Si: 79 at %) and having a thickness of 30 nm was formed by setting the power of a DC power supply to 2.0 kW in a mixed gas atmosphere of Ar and He (gas flow rate ratio Ar:He=20:120) at a gas pressure of 0.3 Pa.

Then, using a target of Mo:Si=4 mol %:96 mol %, a film made of molybdenum, silicon, oxygen, and nitrogen (Mo: 1.6 at %, Si: 38.8 at %, O: 18.8 at %, N: 41.1 at %) and having a thickness of 15 nm was formed by setting the power of a DC power supply to 3.0 kW in Ar, $O_2$, $N_2$, and He (gas flow rate ratio Ar:$O_2$:$N_2$:He=6:5:11:16) at a gas pressure of 0.1 Pa.

The total thickness of the light-shielding film was set to 52 nm. The optical density (OD) of the light-shielding film was 3.0 at the wavelength 193 nm of ArF excimer laser exposure light.

In the manner described above, a binary mask blank of Example 4 was manufactured.

Then, a binary mask was manufactured using this binary mask blank. First, a chemically amplified positive resist film for electron beam writing (PRL009 manufactured by FUJIFILM Electronic Materials Co., Ltd.), which was the same as that described before, was formed on the mask blank.

Then, using an electron beam writing apparatus, a required pattern was written on the resist film formed on the mask blank and, thereafter, the resist film was developed with a predetermined developer, thereby forming a resist pattern.

Then, using the resist pattern as a mask, the three-layer structure light-shielding film was etched, thereby forming a light-shielding film pattern. A mixed gas of $Cl_2$ and $O_2$ ($Cl_2$:$O_2$=4:1) was used as a dry etching gas.

Then, the remaining resist pattern was stripped, thereby obtaining the substrate formed with the light-shielding film pattern. There was almost no change in the optical density (OD) of the light-shielding film at the wavelength 193 nm of ArF excimer laser exposure light as compared with that at the time of the manufacture of the mask blank.

A heat treatment was applied to the obtained substrate formed with the light-shielding film pattern. Specifically, using a heating furnace, the heat treatment was carried out in the atmosphere at a heating temperature of 550° C. for a heating time of 1 hour.

Upon observing a section of the light-shielding film pattern in detail after the heat treatment using a TEM (transmission electron microscope), a coating film with a thickness of about 5 nm was formed in a surface layer portion of a main surface and side walls of a pattern formed by the MoSiON film/MoSi film/MoSiON film (particularly the MoSi film). Further, upon analyzing the composition of this coating film in detail, it was confirmed to be a film composed mainly of Si and oxygen.

In this manner, a binary mask of Example 4 was obtained.

An ArF excimer laser was continuously irradiated on the binary mask subjected to the heat treatment so that the total dose became 30 kJ/cm$^2$. A section of the light-shielding film pattern after the irradiation was observed in detail using a TEM (transmission electron microscope). As a result, a modified layer as conventionally formed was not particularly confirmed and, further, an increase in line width (CD change) was suppressed to 10 nm or less. Therefore, it is seen that the binary mask of Example 4 has extremely high irradiation durability to cumulative irradiation of an exposure light source with a short wavelength of 200 nm or less.

Example 5

Example 5 is the same as Example 4 except that, with respect to a light-shielding film, a MoSiON film (back-surface antireflection layer) was not formed, and a MoSi film (light-shielding layer) and a MoSiON film (front-surface antireflection layer) in the light-shielding film were formed under the following conditions so that the MoSi film (light-shielding layer) was changed to a MoSiN film (light-shielding layer), the thickness thereof and the Si content ratio therein were changed, the thickness of the MoSiON film (front-surface antireflection layer) was changed, and the total thickness of the light-shielding film was changed.

The MoSiN film (light-shielding layer) in the light-shielding film was formed as a film made of molybdenum, silicon, and nitrogen (Mo: 9 at %, Si: 72.8 at %, N: 18.2 at %) and having a thickness of 52 nm. The MoSiON film (front-surface antireflection layer) in the light-shielding film was formed as a film made of molybdenum, silicon, oxygen, and nitrogen (Mo: 1.6 at %, Si: 38.8 at %, O: 18.8 at %, N: 41.1 at %) and having a thickness of 8 nm.

The total thickness of the light-shielding film was set to 60 nm. The optical density (OD) of the light-shielding film was 3.0 at the wavelength 193 nm of ArF excimer laser exposure light.

In the manner described above, a binary mask blank of Example 5 was manufactured.

Then, a light-shielding film pattern-formed substrate was manufactured using this binary mask blank in the same manner as in Example 4. There was almost no change in the optical density (OD) of the light-shielding film at the wavelength 193 nm of ArF excimer laser exposure light as compared with that at the time of the manufacture of the mask blank.

Then, a heat treatment was applied to the obtained light-shielding film pattern-formed substrate under the same conditions as in Example 4.

Upon observing a section of the light-shielding film pattern in detail after the heat treatment using a TEM (transmission electron microscope), a coating film with a thickness of about 5 nm was formed in a surface layer portion of a main surface and side walls of a pattern formed by the MoSiN film/MoSiON film (particularly the MoSiN film). Further, upon analyzing the composition of this coating film in detail, it was confirmed to be a film composed mainly of Si and oxygen.

In this manner, a photomask of Example 5 was obtained.

An ArF excimer laser was continuously irradiated on the photomask subjected to the heat treatment so that the total dose became 30 kJ/cm$^2$. A section of the light-shielding film pattern after the irradiation was observed in detail using a TEM (transmission electron microscope). As a result, a modified layer as conventionally formed was not particularly confirmed and, further, an increase in line width (CD change) was suppressed to 10 nm or less. Therefore, it is seen that the binary mask of Example 5 has extremely high irradiation durability to cumulative irradiation of an exposure light source with a short wavelength of 200 nm or less.

Example 6

A MoSiON film (back-surface antireflection layer), a MoSi film (light-shielding layer), and a MoSiON film (front-surface antireflection layer) were formed as a light-shielding film on a transparent substrate in completely the same manner as in Example 4, thereby manufacturing a binary mask blank. The optical density (OD) of this light-shielding film for an ArF excimer laser was the same as that in Example 4.

Then, a light-shielding film pattern-formed substrate was manufactured using this binary mask blank in the same manner as in Example 4. There was almost no change in the optical density (OD) of the light-shielding film at the wavelength 193 nm of ArF excimer laser exposure light as compared with that at the time of the manufacture of the mask blank.

A treatment of forming a SiON film (protective film) to a thickness of 5 nm was applied to the obtained light-shielding film pattern-formed substrate under the same conditions as in Example 3, thereby obtaining a photomask of Example 6.

An ArF excimer laser was continuously irradiated on the obtained photomask of Example 6 so that the total dose became 30 kJ/cm$^2$. A section of the light-shielding film pattern after the irradiation was observed in detail using a TEM (transmission electron microscope). As a result, a modified layer as conventionally formed was not particularly confirmed and, further, an increase in line width (CD change) was suppressed to 6 nm or less. Therefore, it is seen that the binary mask of Example 6 has extremely high irradiation durability to cumulative irradiation of an exposure light source with a short wavelength of 200 nm or less.

Comparative Example 1

Using a synthetic quartz glass substrate having a 6-inch square size with a thickness of 0.25 inches as a transparent substrate, a light-semitransmissive film made of nitrided molybdenum and silicon was formed on the transparent substrate, thereby manufacturing a phase shift mask blank.

Specifically, using a mixed target of molybdenum (Mo) and silicon (Si) (Mo:Si=10 mol %:90 mol %), reactive sputtering (DC sputtering) was carried out by setting the power of a DC power supply to 3.0 kW in a mixed gas atmosphere of argon (Ar), nitrogen (N$_2$), and helium (He) (gas flow rate ratio Ar:N$_2$:He=5:49:46) at a gas pressure of 0.3 Pa, thereby forming a MoSiN film made of molybdenum, silicon, and nitrogen and having a thickness of 69 nm.

Then, a phase shift mask was manufactured using the phase shift mask blank in the same manner as in Example 1.

Then, a heat treatment was applied to this phase shift mask. Specifically, the heat treatment was carried out in the atmosphere at a heating temperature of 280° C. for a heating time of 2 hours. The MoSiN film after the heat treatment had a transmittance of 6.11% and a phase difference of 175.6 degrees for an ArF excimer laser. Upon observing a section of the MoSiN film in detail after the heat treatment using a TEM (transmission electron microscope), there was no particular change in a surface layer portion of the MoSiN film so that a coating film was not formed.

An ArF excimer laser was continuously irradiated on the obtained phase shift mask of Comparative Example 1 so that the total dose became 30 kJ/cm$^2$. The transmittance and phase difference of the light-semitransmissive film (MoSiN film) after the irradiation were measured. As a result, the transmittance was 7.69% and the phase difference was 170.8 degrees for the ArF excimer laser. Therefore, changes before and after the irradiation were such that the change in transmittance was +1.58% and the change in phase difference was −4.8 degrees, and thus the changes were very large. If the changes on this level occur, the phase shift mask cannot be used any longer as a photomask. Further, a section of a light-semitransmissive film pattern was observed in detail using a TEM (transmission electron microscope). As a result, a modified layer as conventionally formed was confirmed and it was also confirmed that an increase in line width (CD change) due to the modified layer was 20 nm.

Comparative Example 2

A MoSiN film was formed as a light-semitransmissive film on a transparent substrate in the same manner as in Comparative Example 1, thereby manufacturing a phase shift mask blank. Further, a phase shift mask was manufactured using this phase shift mask blank.

Then, a heat treatment was applied to this phase shift mask. Specifically, the heat treatment was carried out in the atmosphere at a heating temperature of 400° C. for a heating time of 2 hours. The MoSiN film after the heat treatment had a transmittance of 7.14% and a phase difference of 178.1 degrees for an ArF excimer laser. Upon observing a section of the MoSiN film in detail after the heat treatment using a TEM (transmission electron microscope), there was no particular change in a surface layer portion of the MoSiN film so that a coating film was not formed.

An ArF excimer laser was continuously irradiated on the obtained phase shift mask of Comparative Example 2 so that the total dose became 30 kJ/cm$^2$. The transmittance and phase difference of the light-semitransmissive film (MoSiN film) after the irradiation were measured. As a result, the transmittance was 7.77% and the phase difference was 174.8 degrees for the ArF excimer laser. Therefore, changes before and after the irradiation were such that the change in transmittance was +0.63% and the change in phase difference was −3.3 degrees, and thus the changes were very large. If the changes on this level occur, the phase shift mask cannot be used any longer as a photomask. Further, a section of a light-semitransmissive film pattern was observed in detail using a TEM (transmission electron microscope). As a result, a modified layer as conventionally formed was confirmed and it was also confirmed that an increase in line width (CD change) due to the modified layer was 16 nm.

While this invention has been described with reference to the plurality of Examples, this invention is not limited thereto. Various changes that can be understood by a person skilled in the art can be made to the structures and details of this invention within the spirit and scope of this invention described in claims.

DESCRIPTION OF SYMBOLS 1 transparent substrate
2 light-semitransmissive film
3 resist film
4 protective film
10 phase shift mask blank
20 thin film pattern-formed substrate (phase shift mask)

The invention claimed is:

1. A method of manufacturing a photomask having, on a transparent substrate, a transfer pattern formed by patterning a thin film, the method comprising:
preparing a photomask blank having, on the transparent substrate, a thin film made of a material containing a metal and silicon;
forming a thin film pattern by patterning the thin film of the photomask blank; and
performing an oxygen plasma treatment to modify a main surface and side walls of the formed thin film pattern in advance so as to prevent a transfer characteristic of the thin film pattern from changing more than a predetermined degree even when exposure light having a wavelength of 200 nm or less is cumulatively irradiated on the thin film pattern.

2. The photomask manufacturing method according to claim 1, wherein a layer containing silicon and oxygen is formed in a surface layer of the thin film pattern by the oxygen plasma treatment.

3. The photomask manufacturing method according to claim 1, wherein a surface layer, modified by the oxygen plasma treatment, of the thin film pattern has a thickness of 10 nm or less.

4. The photomask manufacturing method according to claim 1, wherein the thin film is a light-semitransmissive film made of a material containing a compound of transition metal silicide.

5. The photomask manufacturing method according to claim 4, wherein the transition metal silicide is molybdenum silicide.

6. The photomask manufacturing method according to claim 1, wherein the thin film is a light-shielding film made of a material containing a compound of transition metal silicide.

7. The photomask manufacturing method according to claim 6, wherein the transition metal silicide is molybdenum silicide.

8. A method of manufacturing a photomask having, on a transparent substrate, a transfer pattern formed by patterning a thin film, the method comprising:
preparing a photomask blank having, on the transparent substrate, a thin film made of a material containing a metal and silicon;
forming a thin film pattern by patterning the thin film of the photomask blank; and
forming a protective film on the formed thin film pattern so as to prevent a transfer characteristic of the thin film pattern from changing more than a predetermined degree even when exposure light having a wavelength of 200 nm or less is cumulatively irradiated on the thin film pattern.

9. The photomask manufacturing method according to claim 8, wherein the protective film is made of a material containing silicon and oxygen.

10. The photomask manufacturing method according to claim 8, wherein the protective film has a thickness of 15 nm or less.

11. The photomask manufacturing method according to claim 8, wherein the thin film is a light-semitransmissive film made of a material containing a compound of transition metal silicide.

12. The photomask manufacturing method according to claim 11, wherein the transition metal silicide is molybdenum silicide.

13. The photomask manufacturing method according to claim 8, wherein the thin film is a light-shielding film made of a material containing a compound of transition metal silicide.

14. The photomask manufacturing method according to claim 13, wherein the transition metal silicide is molybdenum silicide.

15. The photomask manufacturing method according to claim 8, wherein the protective film comprises one of SiON, $SiO_2$, SiOC, and SiOCN.

16. The photomask manufacturing method according to claim 15, wherein the composition of the protective film is:
   Si=20 to 50 at %,
   O=30 to 60 at %,
   N=0 to 40 at %, and
   C=0 to 20 at %.

17. The photomask manufacturing method according to claim 8, wherein the step of forming a protective film comprises depositing a material that comprises the protective film.

\* \* \* \* \*